(12) United States Patent
Dobashi et al.

(10) Patent No.: US 7,501,893 B2
(45) Date of Patent: Mar. 10, 2009

(54) VARIABLE GAIN AMPLIFIER CIRCUIT

(75) Inventors: Nagayoshi Dobashi, Atsugi (JP);
Shigeki Mabuchi, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 11/877,895

(22) Filed: Oct. 24, 2007

(65) Prior Publication Data

US 2008/0129384 A1    Jun. 5, 2008

(30) Foreign Application Priority Data

Nov. 30, 2006  (JP) .............................. 2006-324045

(51) Int. Cl.
*H03F 3/45*    (2006.01)

(52) U.S. Cl. ................... 330/254; 330/51; 330/260

(58) Field of Classification Search ............... 330/51, 330/254, 260
See application file for complete search history.

(56) References Cited

U.S. PATENT DOCUMENTS

| 5,684,431 | A  | * | 11/1997 | Gilbert et al. ............ 330/254 |
| 6,445,248 | B1 |   | 9/2002  | Gilbert .................... 330/51 |
| 7,259,620 | B2 | * | 8/2007  | Zou ........................ 330/51 |
| 2005/0057304 | A1 | | 3/2005 | Gilbert et al. ............ 330/254 |

FOREIGN PATENT DOCUMENTS

| EP | 1229644  | 8/2002  |
| GB | 2426132  | 11/2006 |
| JP | 4-102311 | 9/1992  |

OTHER PUBLICATIONS

European Search Report: Application/Patent No. 07020764.2-1233, Feb. 20, 2008.

* cited by examiner

*Primary Examiner*—Khanh V Nguyen
(74) *Attorney, Agent, or Firm*—Ladas & Parry LLP

(57) ABSTRACT

A variable gain amplifier circuit capable of eliminating circuit elements and the area for circuits when formed into an integrated circuit is disclosed. The circuit includes plural differential circuits, one of the input terminals of each of the differential circuits being connected in common to a signal input terminal, any one of the differential circuits being selected to operate; an output circuit having an input terminal connected in common to each output terminal of the differential circuits, the output circuit inputting an output signal of any of differential circuits and outputting an output signal from the signal output terminal; and plural resistors connected in series between the signal output terminal and a reference voltage terminal, in which each of junctions between the resistors is connected to one of the other input terminals of the differential circuits.

3 Claims, 7 Drawing Sheets

VARIABLE GAIN AMPLIFIER CIRCUIT

BACKGROUND OF THE INVENTION

1. Field of the Invention

The present invention generally relates to variable gain amplifier circuits, and particularly to variable gain amplifier circuits adjusting the level of audio signal by varying the gain of the signal based on a control signal.

2. Description of the Related Art

As an exemplary variable gain amplifier circuit, there is known a variable gain amplifier circuit adjusting the level of an audio signal by varying the gain of the signal based on a control signal corresponding to the peak-to-peak level of the audio signal captured from various audio sources.

FIG. 6 is a schematic circuit diagram of a conventional variable gain amplifier circuit integrated into a semiconductor chip. As shown in FIG. 6, an audio signal from various audio sources is input into a terminal 1, and the input audio signal is supplied to each non-inverting input terminal of operational amplifiers 2, 4, 6, 8.

As shown in FIG. 6, the output terminal and the inverting input terminal of the operational amplifier 2 are connected to each other via a resistor R1. The inverting input terminal is connected to one end of resistor R2. A referential voltage (Vref) is applied to the other end of the resistor R2. The output terminal of the operational amplifier 2 is connected to a terminal 10. As a result, the operational amplifier 2 is configured as a non-inverting amplifier. The operational amplifier 2 operates only when, for example, a high-level control signal is supplied to the terminal 3 of the operational amplifier 2. The amplification of the non-inverting amplifier is determined by R1 and R2 and is obtained by the formula (=1+R1/R2). In this example, the amplification of the non-inverting amplifier is 6 dB (2 times).

The output terminal and the inverting input terminal of the operational amplifier 4 are connected to each other via a resistor R3. The inverting input terminal is connected to one end of resistor R4. The referential voltage (Vref) is applied to the other end of the resistor R4. The output terminal of the operational amplifier 4 is connected to a terminal 10. As a result, the operational amplifier 4 is configured as a non-inverting amplifier. The operational amplifier 4 operates only when, for example, a high-level control signal is supplied to the terminal 5 of the operational amplifier 4. The amplification of the non-inverting amplifier is determined by R3 and R4 and is obtained by the formula (=1+R3/R4). In this example, the amplification of the non-inverting amplifier is 4 dB (1.58 times).

The output terminal and the inverting input terminal of the operational amplifier 6 are connected to each other via a resistor R5. The inverting input terminal is connected to one end of resistor R6. The referential voltage (Vref) is applied to the other end of the resistor R6. The output terminal of the operational amplifier 4 is connected to a terminal 10. As a result, the operational amplifier 6 is configured as a non-inverting amplifier. The operational amplifier 6 operates only when, for example, a high-level control signal is supplied to the terminal 7 of the operational amplifier 6. The amplification of the non-inverting amplifier is determined by R5 and R6 and is obtained by the formula (=1+R5/R6). For example, the amplification of the non-inverting amplifier is 2 dB (1.26 times).

The output terminal and the inverting input terminal of the operational amplifier 8 are connected to each other. The output terminal of the operational amplifier 8 is connected to the terminal 10. As a result, the operational amplifier 8 is configured as a buffer amplifier. The operational amplifier 8 operates only when, for example, a high-level control signal is supplied to the terminal 9 of the operational amplifier B. The amplification of the buffer amplifier is 0 dB (1 time).

Only one of the control signals supplied to the terminals 3, 5, 7, 9 is high-level. Accordingly, only one of the operational amplifiers 2, 4, 6, 8 is to be operated and an audio signal amplified by the one of the operational amplifiers 2, 4, 6, 8 is output from the terminal 10.

FIG. 7 is a schematic circuit diagram of an exemplary non-inverting amplifier of the operational amplifier 2. The configuration of the other non-inverting amplifiers of the operational amplifiers 4, 6, 8 is substantially the same as the configuration of the operational amplifier 2. In FIG. 7, the emitters of npn transistors Q1, Q2 are connected to each other and are grounded via a constant current source 11 and a switch 12. The base of the transistor Q1 is connected to a terminal 1, and the collector of the transistor Q1 is connected to voltage Vcc via a constant current source 13. The base of the transistor Q2 is connected to the junction of one end of resistor R1 and one end of resistor R2. The collector of the transistor Q2 is connected to the voltage Vcc. As a result, a differential circuit is configured with the transistors Q1 and Q2.

The collector of the transistor Q1, that is the output of the differential circuit, is connected to the base of a pnp transistor Q3. The emitter of the transistor Q3 is connected to the voltage Vcc. The collector of the transistor Q3 is grounded via a constant current source 14 and a switch 15. As a result, the transistor Q3 operates as an output circuit with the emitter grounded. The collector of the transistor Q3 is connected to the terminal 10, the base of the transistor Q2 via the resistor R1, and the base of the transistor Q3 via a capacitor C0 for phase compensation.

The reference voltage is applied to the base of the transistor Q2 via the resistor R2. Switches 12, 15 are closed only when high-level control signal is applied to the terminal 3 to flow current through transistors Q1 through Q3.

Japanese Utility Model Publication Application No. H4-102311 discloses an amplifier circuit in which gain of the amplifier circuit is determined by selecting only one of two differential amplifier circuits in the amplifier circuit so as to apply power to the selected differential amplifier only.

FIG. 6 is a schematic circuit diagram showing an example of a conventional variable gain amplifier circuit. As shown in FIG. 6, the resistors R1 through R6 are necessary to be provided to set the amplification of each non-inverting amplifier. Further, as shown in FIG. 7, an output circuit including a transistor, a constant-current source, and a switch is necessary for each non-inverting amplifier. Unfortunately, because of the structure, the number of circuit elements of the above conventional variable gain amplifier circuit is large and, accordingly, the area of semiconductor integrated circuits becomes large to integrate the circuit elements in the semiconductor integrated circuit.

SUMMARY OF THE INVENTION

The present invention was made in light of the above-mentioned disadvantages, and may provide a variable gain amplifier circuit having relatively fewer circuit elements and thereby reducing the area required to form the circuit in a semiconductor integrated circuit.

According to one aspect of the present invention, there is provided a variable gain amplifier circuit including: plural differential circuits (22, 24, 26, 28), each having two input terminals and one output terminal, one of the input terminals of each of the differential circuits being connected in common to a signal input terminal to input a signal to each of the differential circuits, any one of the differential circuits (22, 24, 26, 28) being selected to operate; an output circuit (30) having an input terminal connected in common to each output terminal of the differential circuits (22, 24, 26, 28) and one signal output terminal (50), the output circuit inputting an output signal of any of differential circuits (22, 24, 26, 28) and outputting an output signal from the signal output terminal (50); and plural resistors (R12, R11, R13, R14) connected in series between the signal output terminal (50) of the output circuit (30) and a terminal (51) to which a reference voltage is applied, in which each of junctions between the resistors (R12, R11, R13, R14) is connected to one of the other input terminals of the differential circuits (22, 24, 26, 28).

According to another aspect of the present invention, there is provided a variable gain amplifier circuit in which each of the differential circuits (22, 24, 26, 28) includes a pair of transistors; and a collector of a transistor whose base is regarded as the one of the input terminals of the differential circuits is connected to the output terminal.

According to still another aspect of the present invention, there is provided a variable gain amplifier circuit in which the output circuit (30) includes a common-emitter transistor whose base is connected to each of the output terminal of the differential circuits and whose collector is connected to the signal output terminal (50).

It should be noted that the above reference numbers in parentheses are for illustrative purposes only and do not limit the scope and spirit of the present invention to the described example.

According to an embodiment of the present invention, the number of resistors used for setting amplification of each non-inverting amplifier may be reduced, thereby reducing the area required to form a variable gain amplifier circuit in a semiconductor integrated circuit.

DETAILED DESCRIPTION OF THE PREFERRED EMBODIMENTS

Figure 1:
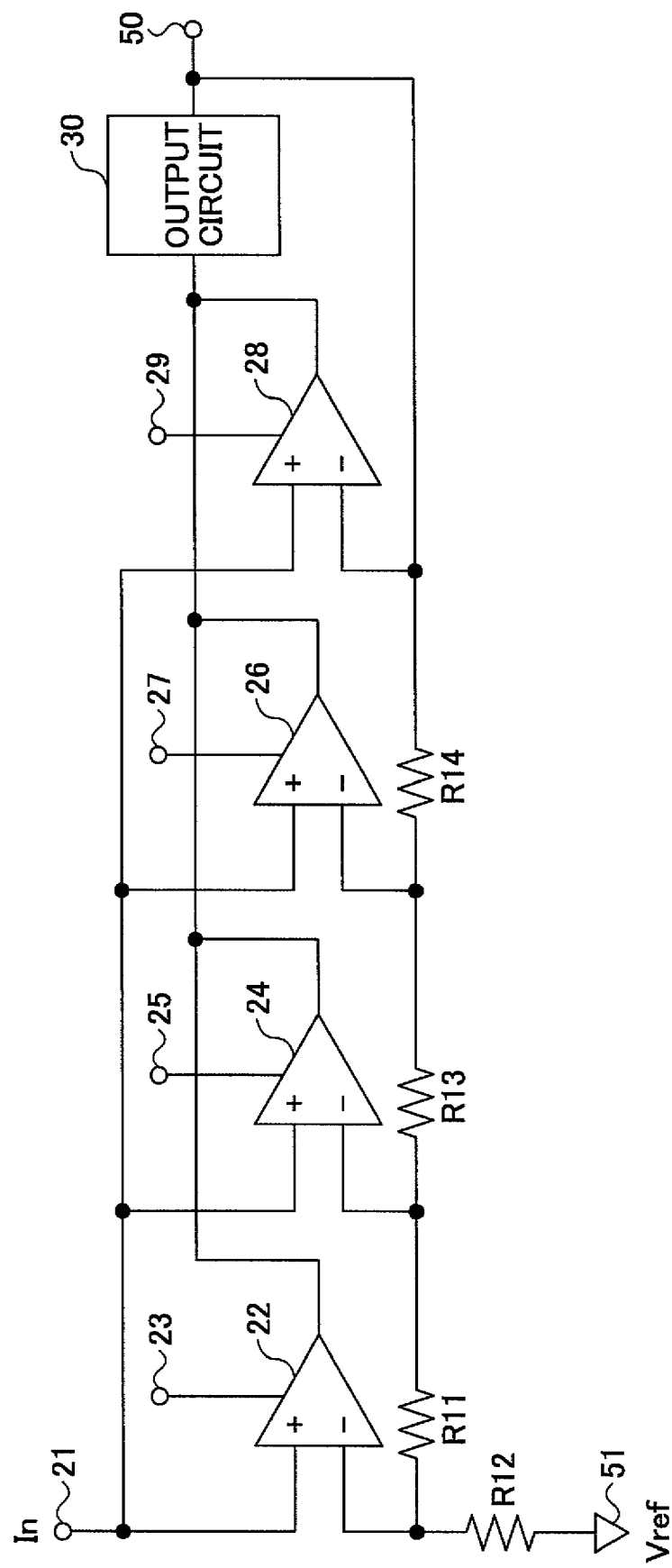
FIG. 1 is a schematic circuit diagram showing an exemplary variable gain amplifier circuit according to an embodiment of the present invention.
Figure 2:
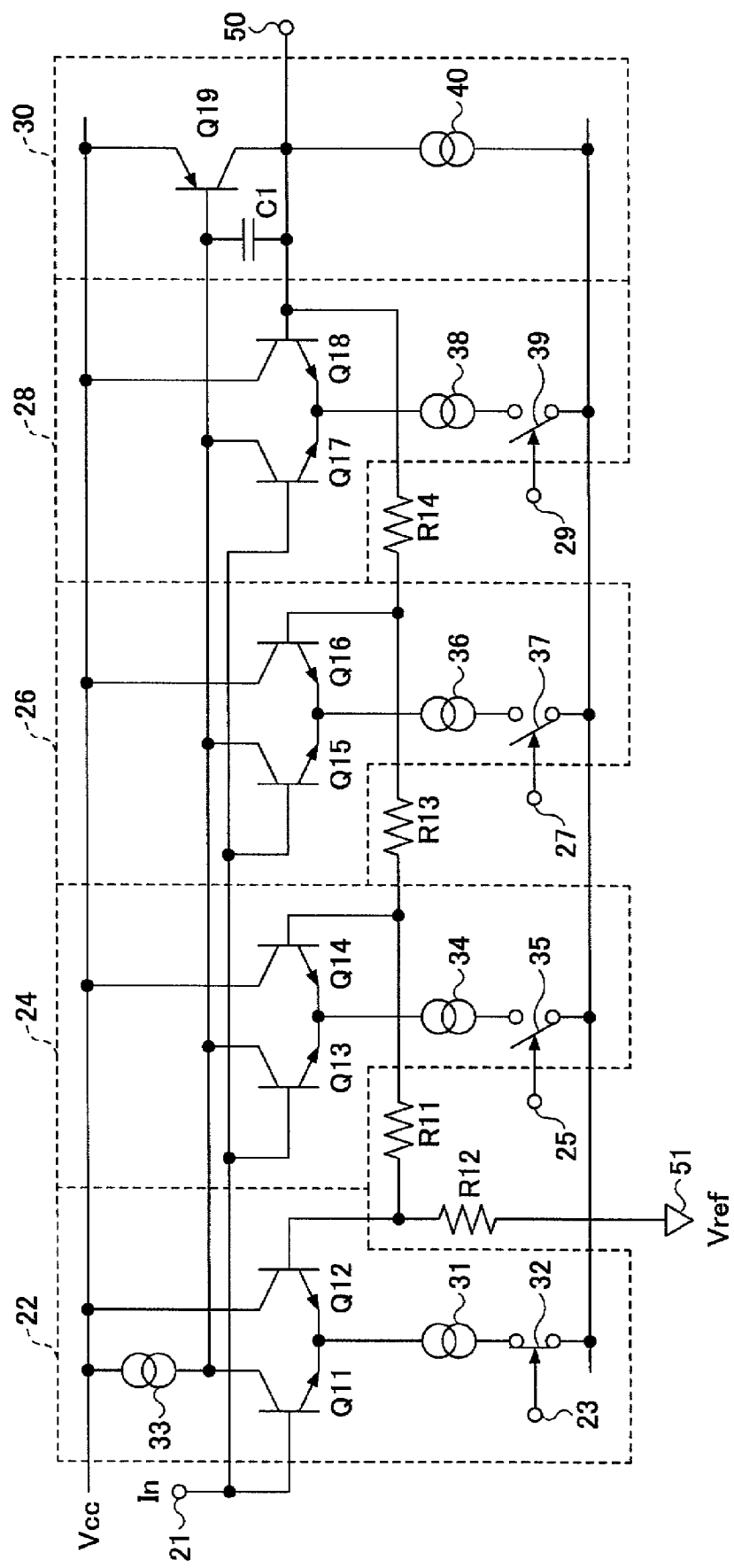
FIG. 2 is a circuit diagram showing an exemplary variable gain amplifier circuit according to an embodiment of the present invention.

FIG. 1 is a schematic circuit diagram showing an exemplary variable gain amplifier circuit according to an embodiment of the present invention. FIG. 2 is a circuit diagram showing an exemplary variable gain amplifier circuit according to an embodiment of the present invention. It should be noted that the entire variable gain amplifier circuit is formed in a semiconductor integrated circuit.

In FIG. 1, an audio signal from various audio sources is input into a signal input terminal 21. The input audio signal is supplied in common to each non-inverting input terminal of differential circuits 22, 24, 26, 28.

The output terminal of the differential circuit 22 is connected to a signal output terminal 50 via an output circuit 30. The inverting input terminal of the differential circuit 22 is connected to the junction of one end of resistor R11 and one end of resistor R12. The other end of the resistor R12 is connected to a terminal 51 where a reference voltage Vref is applied. The other end of the resistor R11 is connected to the signal output terminal 50 via resistors R13, R14.

Control signals are separately supplied to terminals 23, 25, 27, and 29. Only one of the control signals is high-level. When the high-level control signal is supplied to the terminal 23 of the differential circuit 22, only the differential circuit 22 operates. The amplification of the non-inverting amplifier of the differential circuit 22 (Av1) is given by the following formula:

$$Av1=1+(R11+R13+R14)/R12 \quad (1)$$

The output terminal of the differential circuit 24 is connected to the signal output terminal 50 via the output circuit 30. The inverting input terminal of the differential circuit 24 is connected to the junction of one end of resistor R11 and one end of resistor R13. The other end of the resistor R11 is connected to the terminal 51 via the resistor R12. The other end of the resistor R13 is connected to the signal output terminal 50 via resistor R14.

When the high-level control signal is supplied to the terminal 25 of the differential circuit 24, only the differential circuit 24 operates. The amplification of the non-inverting amplifier of the differential circuit 24 (Av2) is given by the following formula:

$$Av2=1+(R13+R14)/(R12+R11) \quad (2)$$

The output terminal of the differential circuit 26 is connected to the signal output terminal 50 via the output circuit 30. The inverting input terminal of the differential circuit 26 is connected to the junction of one end of resistor R13 and one end of resistor R14. The other end of the resistor R13 is connected to the terminal 51 via the resistors R11 and R12. The other end of the resistor R14 is connected to the signal output terminal 50.

When the high-level control signal is supplied to the terminal 27 of the differential circuit 26, only the differential circuit 26 operates. The amplification of the non-inverting amplifier of the differential circuit 26 (Av3) is given by the following formula:

$$Av3=1+R14/(R12+R11+R13) \quad (3)$$

The output terminal of the differential circuit 28 is connected to the signal output terminal 50 via the output circuit 30. The inverting input terminal of the differential circuit 28 is connected to the junction of one end of resistor R14 and the signal output terminal 50.

When the high-level control signal is supplied to the terminal 29 of the differential circuit 28, only the differential circuit 28 operates. The amplification of the non-inverting amplifier of the differential circuit 28 (Av4) is given by the following formula:

$$Av4=1(0 \text{ dB}) \quad (4)$$

In this example, the following values are given:

R11=1.3 kΩ

R12=5 kΩ

R13=1.6Ω
R14=2.1Ω

The amplification of each differential circuit is given as follows:

Av1=2(6 dB) by formula (1)
Av2=1.58(4 dB) by formula (2)
Av3=1.26(2 dB) by formula (3)

As shown in FIG. 2, the emitters of npn transistors Q11, Q12 are commonly grounded via a constant current source 31 and a switch 32. The base of the transistor Q11 is connected to an input terminal 21. The collector of the transistor Q11 is connected to voltage Vcc via a constant current source 33. The base of the transistor Q12 is connected to the junction of one end of resistor R11 and one end of resistor R12. The collector of the transistor Q12 is connected to the voltage Vcc. As a result, the transistors Q11, Q12 constitute the differential circuit 22.

The emitters of npn transistors Q13, Q14 are commonly grounded via a constant current source 34 and a switch 35. The base of the transistor Q13 is connected to an input terminal 21. The collector of the transistor Q13 is connected to voltage Vcc via a constant current source 33. The base of the transistor Q14 is connected to the junction of one end of resistor R11 and one end of resistor R13. The collector of the transistor Q14 is connected to the voltage Vcc. As a result, the transistors Q13, Q14 constitute the differential circuit 24.

The emitters of npn transistors Q15, Q16 are commonly grounded via a constant current source 36 and a switch 37. The base of the transistor Q15 is connected to an input terminal 21. The collector of the transistor Q15 is connected to voltage Vcc via a constant current source 33. The base of the transistor Q16 is connected to the junction of one end of resistor R13 and one end of resistor R14. The collector of the transistor Q16 is connected to the voltage Vcc. As a result, the transistors Q15, Q16 constitute the differential circuit 26.

The emitters of npn transistors Q17, Q18 are commonly grounded via a constant current source 38 and a switch 39. The base of the transistor Q17 is connected to an input terminal 21. The collector of the transistor Q17 is connected to voltage Vcc via a constant current source 33. The base of the transistor Q18 is connected to the junction of one end of resistor R14 and the signal output terminal 50. The collector of the transistor Q18 is connected to the voltage Vcc. As a result, the transistors Q17, Q18 constitute the differential circuit 28.

The collectors of the transistors Q11, Q13, Q15, and Q17, which are outputs of the differential circuits 22, 24, 26, and 28, respectively, are connected in common to the base of npn transistor Q19 of the output circuit 30. The emitter of the transistor Q19 is connected to the voltage Vcc. The collector of the transistor Q19 is grounded via a constant current source 40. The transistor Q19 forms a common-emitter circuit. The collector of the transistor Q19 is connected to the signal output terminal 50, and the base of the transistor Q19 via a capacitor C1 for phase compensation.

Figure 3:
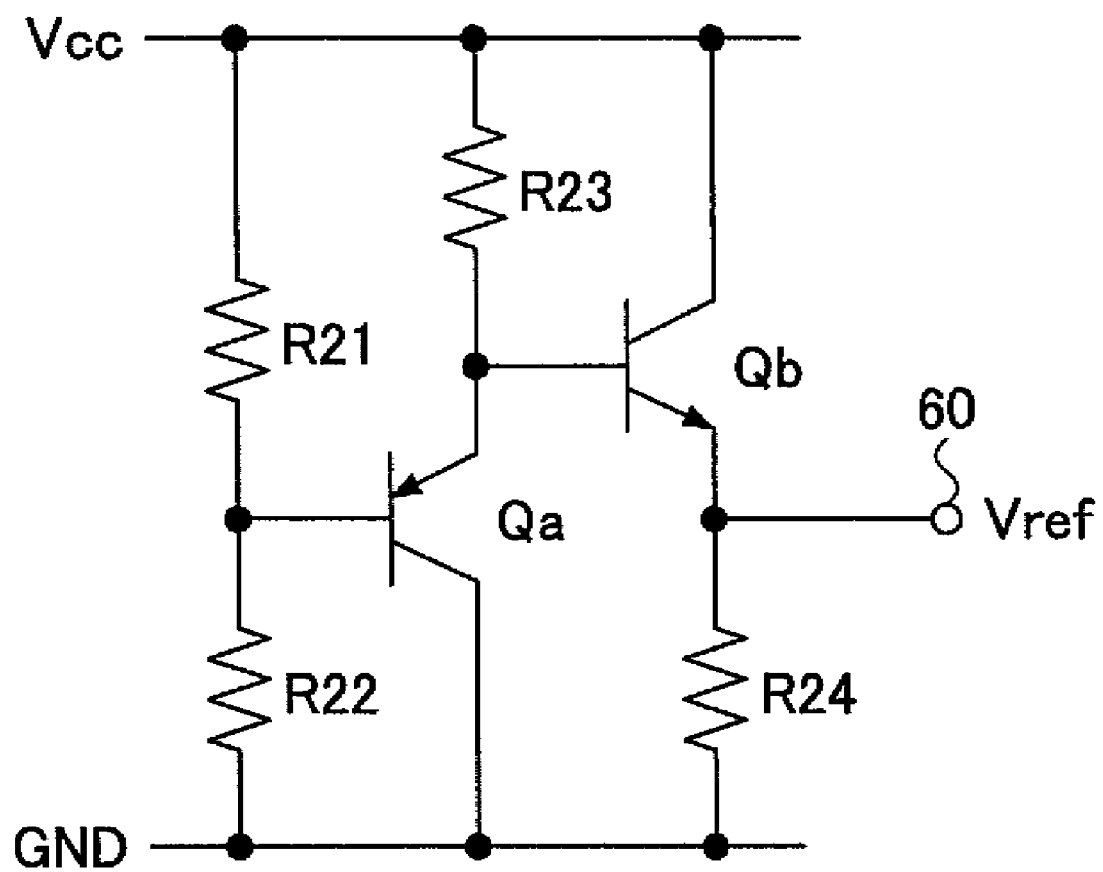
FIG. 3 is a circuit diagram showing an exemplary reference voltage generating circuit according to an embodiment of the present invention.

FIG. 3 is a circuit diagram showing a reference voltage generating circuit connected to the terminal 51 according to an embodiment of the present invention. As shown in FIG. 3, resistors R21 and R22 are connected in series between voltage Vcc and circuit ground. Because of the configuration, the voltage at the junction between the resistor R21 and R22 is given by the formula: Vcc*(R22/(R21+R22)). The voltage is output from a terminal 60 as a reference voltage Vref via an emitter follower circuit including a transistor Qa and a resistor R23 and another emitter follower circuit including a transistor Qb and a resistor R24.

Figure 4:
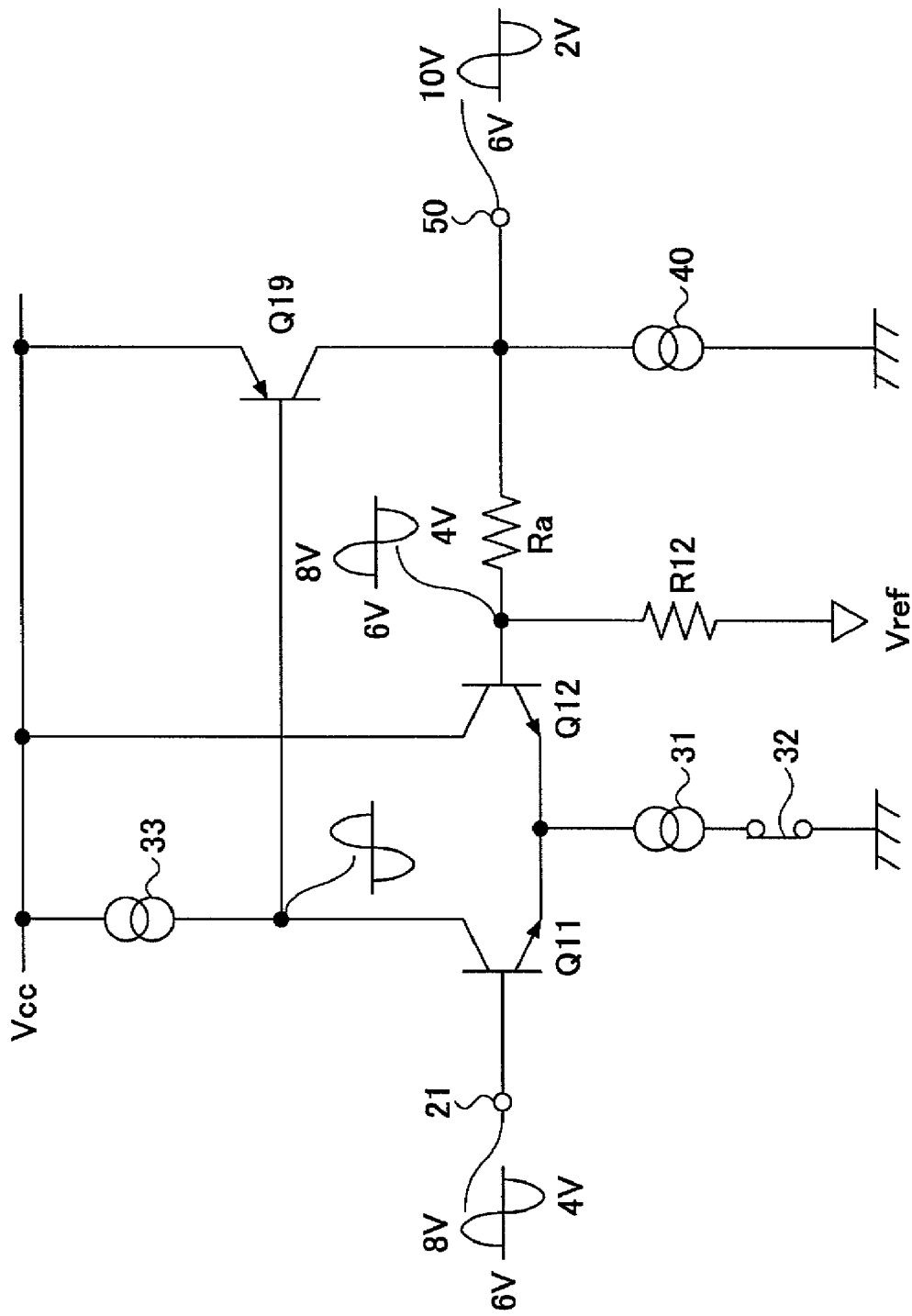
FIG. 4 is a circuit diagram partially extracted from FIG. 2.
Figure 5:
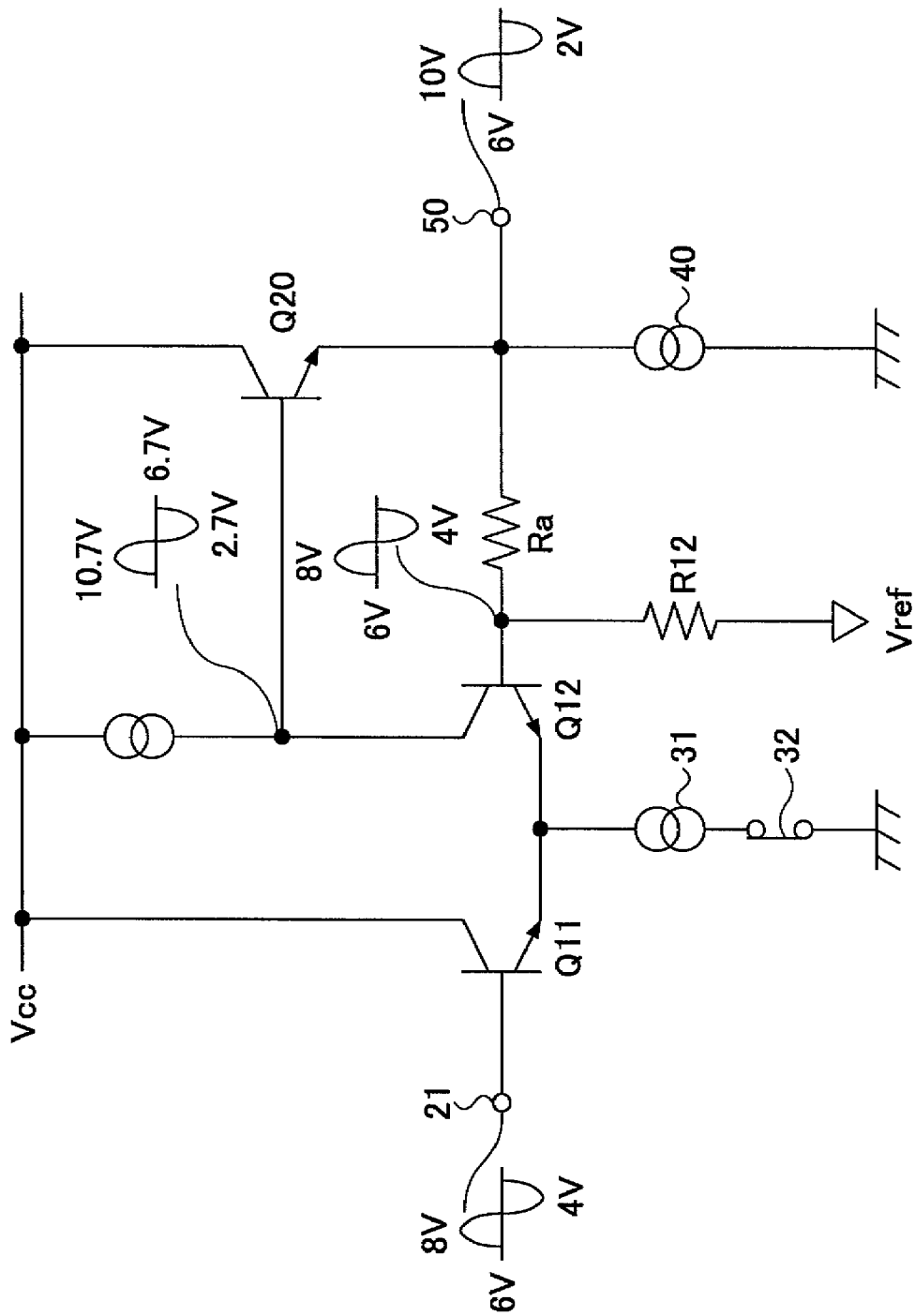
FIG. 5 is a circuit diagram of a modified embodiment from the embodiment of FIG. 4.

FIG. 4 is a circuit diagram extracting the differential circuit 22 and the output circuit 30 from the circuit diagram of FIG. 2. FIG. 5 is a circuit diagram modified from the circuit diagram of FIG. 4.

According to an embodiment of the present invention, as shown in FIG. 4, the inverted signal from the collector of the transistor Q11 is further inverted by the common-emitter transistor Q19, and the further inverted signal is output from the signal output terminal 50. On the other hand, according to the modified circuit of FIG. 5, a signal having the same phase as that of the input signal from the terminal 21 is transmitted to the base of an npn transistor Q20 forming an emitter follower circuit, and the signal is output from the signal output terminal 50. In both FIGS. 4 and 5, it is assumed that Ra is given as follows:

Ra=R11+R13+R14

In the circuit of FIG. 5, when a signal ranging between a minimum voltage 4 V and a maximum voltage 8 V with a center voltage of 6 V (Vref) is input from the signal input terminal 21, the voltage at the signal output terminal 50 changes between a minimum voltage 2 V and a maximum voltage 10 V with a center voltage of 6 V. On the other hand, the collector voltage of the transistor Q12 changes between a minimum voltage 2.7 V and a maximum voltage 10.7 V with a center voltage of 6.7 V due to the voltage drop approximately 0.7 V between the base and the emitter of the transistor Q20.

Further, the base voltage of the transistor Q12, which is a divided voltage of the voltage at the signal output terminal 50, is given by the resistances of the resistors Ra and R12. Therefore, the base voltage of the transistor Q12 changes between a minimum voltage 4 V and a maximum voltage 8 V with a center voltage of 6 V. In this case, however, the minimum voltage of the base of the transistor Q12 is 4 V, and the minimum voltage of the collector of the transistor Q12 is 2.7 V. Therefore, the bias voltage applied between the base and the collector of the transistor 12 is so low that the transistor cannot work normally because an input signal close to the minimum voltage level becomes OFF.

On the other hand, in the configuration according to the embodiment of the present invention shown in FIG. 4, when a signal ranging between a minimum voltage 4 V and a maximum voltage 8 V with a center voltage of 6 V (Vref) is input from the signal input terminal 21, the voltage at the signal output terminal 50 changes between a minimum voltage 2 V and a maximum voltage 10 V with a center voltage of 6 V. Further, since the base voltage of the transistor Q12 is a divided voltage of the voltage at the signal output terminal 50 and can be given by the resistances of the resistors Ra and R12, the base voltage of the transistor Q12 changes between a minimum voltage 4 V and a maximum voltage 8 V with a center voltage of 6 V. However, since the voltage of the collector of the transistor 12 is the voltage Vcc, the transistor Q12 can operate in the full range between the minimum and the maximum values of the signal.

Figure 6:
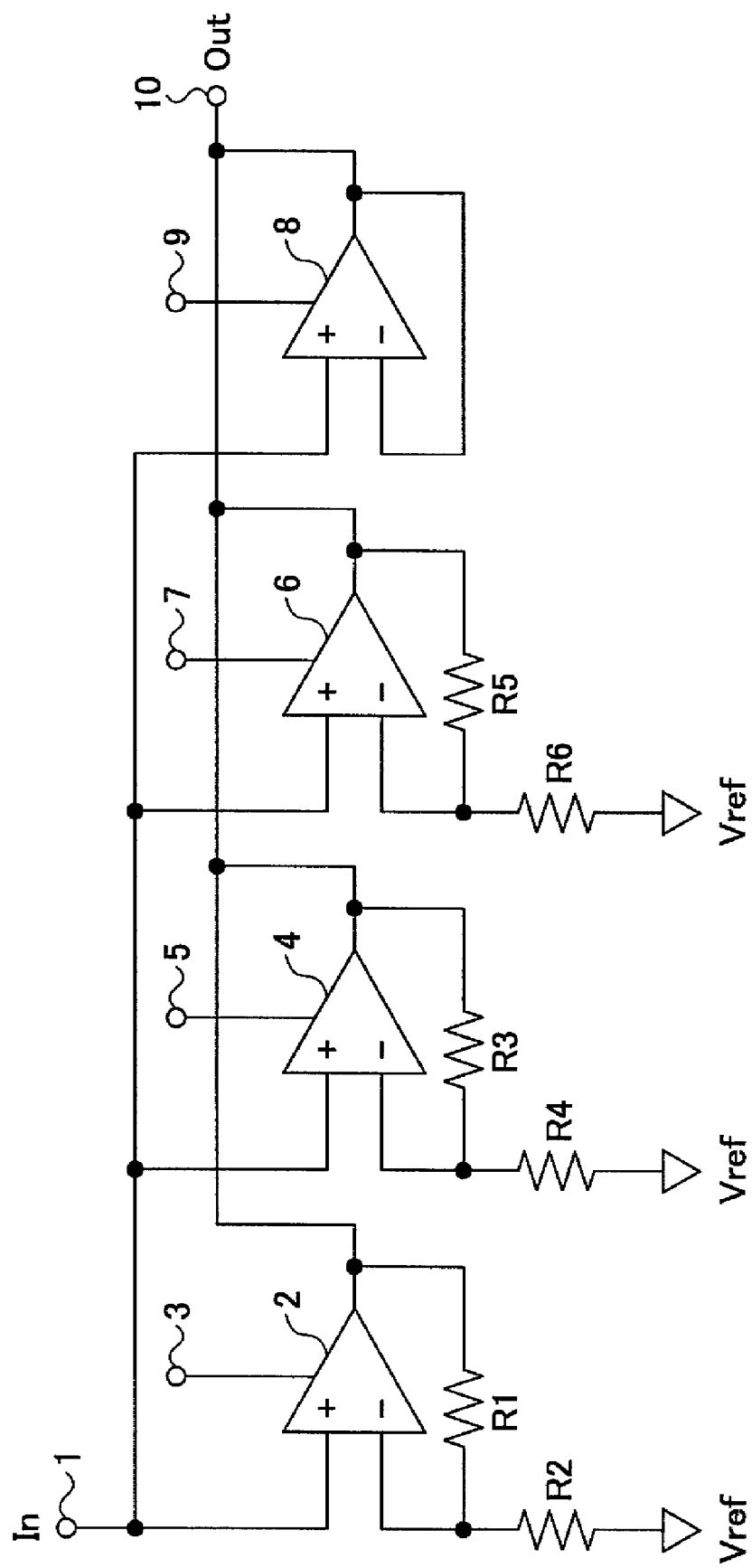
FIG. 6 is a schematic circuit diagram showing a conventional variable gain amplifier circuit.
Figure 7:
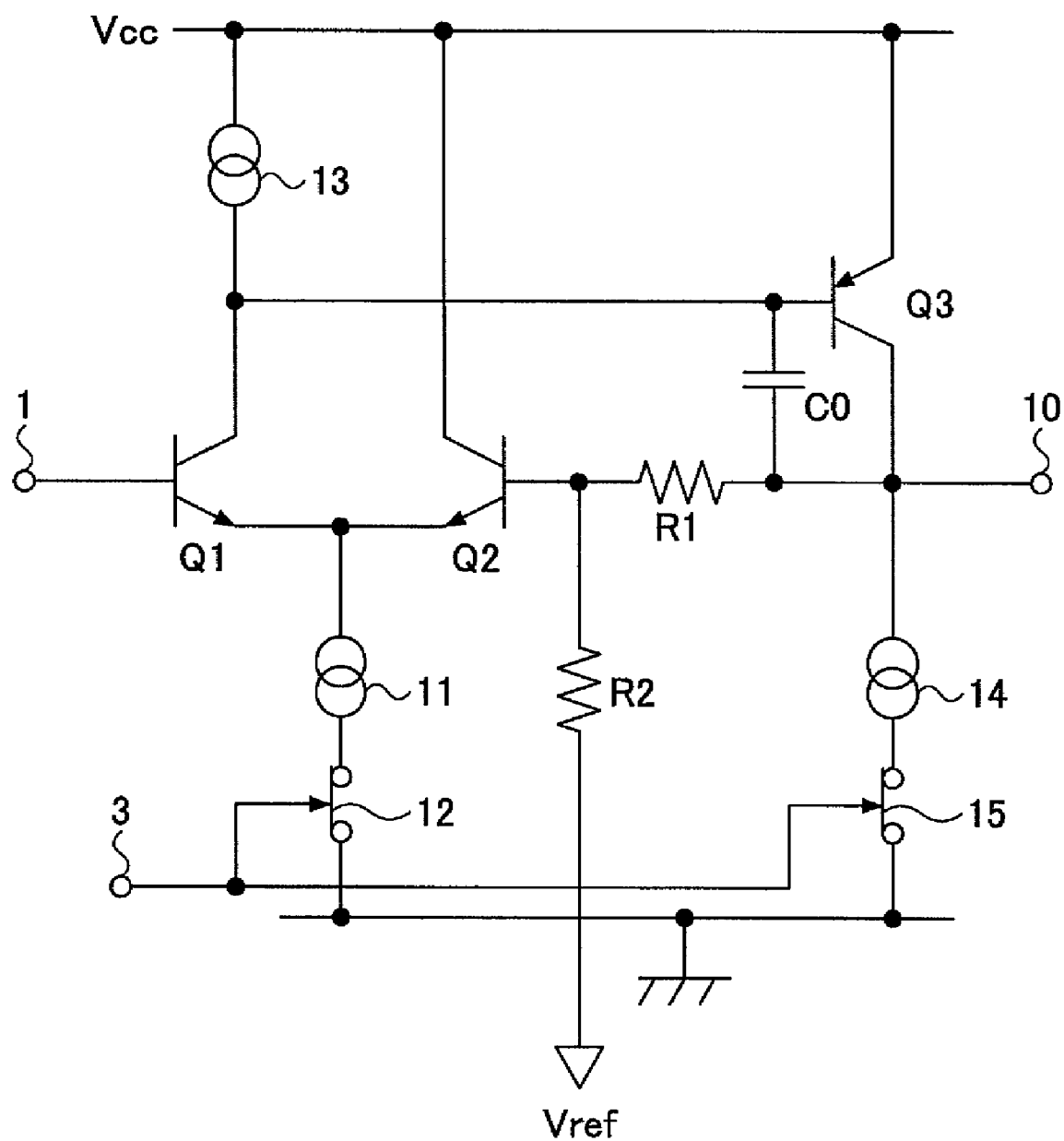
FIG. 7 is a circuit diagram showing a non-inverting amplifier used in a conventional variable gain amplifier circuit.

When the conventional configuration shown in FIG. 6 is formed into a semiconductor integrated circuit, it is necessary to provide the area where resistors R1, R2, R3, R4, R5, and R6 are to be formed in the circuit. On the other hand, when a circuit according to the embodiment of the present invention shown in FIG. 1 is formed into a semiconductor integrated circuit, it is necessary to secure the area where resistors R11, R12, R13, and R14 are to be formed in the circuit. However, the area for the resistors R11, R12, R13 is substantially the same as the area necessary for forming the resistors R1 and R2. Therefore, the area for the resistors R3, R4, R5, and R6 can be eliminated. It is assumed that area necessary for forming a resistor of 1 kΩ is substantially equal to the area for one transistor. According to the example of FIG. 6, the resistance of R3, R4, R5, and R6 is approximately 14 kΩ. Therefore, in the example of FIG. 1, an area for 14 transistors can be eliminated.

Further, according to the circuit diagram of FIG. 1, the resistors R11 through R14 are always used when any of the differential circuits 22, 24, 26, and 28 is selected and operated. Because of the feature, a certain number of resistors can be eliminated. Further, the output circuit 30 is commonly used when any of the differential circuits 22, 24, 26, and 28 is selected and used. Because of the feature, a certain number of circuit elements can be eliminated, therefore reducing the area necessary for the circuit elements otherwise formed in a semiconductor integrated circuit.

Though an exemplary embodiment is described in detail above, the present invention is not limited to the specific embodiment described above, and variations and modification may be made without departing from the spirit and scope of the present invention.

The present invention is based on Japanese Priority Application No. 2006-324045 filed Nov. 30, 2006, the entire contents of which are hereby incorporated herein by reference.

What is claimed is:

1. A variable gain amplifier circuit comprising:
   plural differential circuits, each differential circuit having two input terminals and one output terminal, one of the input terminals of each of the differential circuits being connected in common to a signal input terminal to input a signal to each of the differential circuits, any one of the differential circuits being selected to operate;
   an output circuit having an input terminal connected in common to each output terminal of the differential circuits and one signal output terminal, the output circuit inputting an output signal of any of differential circuits and outputting an output signal from the signal output terminal; and
   plural resistors connected in series between the signal output terminal and a terminal to which a reference voltage is applied, wherein:
   each of junctions between the resistors is connected to one of the other input terminals of the differential circuits.

2. The variable gain amplifier circuit according to claim 1, wherein:
   each of the differential circuits includes a pair of transistors; and
   a collector of a transistor whose base is regarded as the one of the input terminals of each of the differential circuits is connected to the output terminal.

3. The variable gain amplifier circuit according to claim 2, wherein:
   the output circuit includes a common-emitter transistor whose base is connected to each of the output terminals of the differential circuits and whose collector is connected to the signal output terminal.

* * * * *